(12) United States Patent
Zhuang et al.

(10) Patent No.: US 6,824,814 B2
(45) Date of Patent: Nov. 30, 2004

(54) PREPARATION OF LCPMO THIN FILMS WHICH HAVE REVERSIBLE RESISTANCE CHANGE PROPERTIES

(75) Inventors: Wei-Wei Zhuang, Vancouver, WA (US); Sheng Teng Hsu, Camas, WA (US); Wei Pan, Vancouver, WA (US); Masayuki Tajiri, Nara (JP)

(73) Assignee: Sharp Laboratories of America, Inc., Camas, WA (US)

( * ) Notice: Subject to any disclaimer, the term of this patent is extended or adjusted under 35 U.S.C. 154(b) by 232 days.

(21) Appl. No.: 10/153,841

(22) Filed: May 21, 2002

(65) Prior Publication Data
US 2003/0219534 A1 Nov. 27, 2003

(51) Int. Cl.[7] .............................. B05D 5/12; B05D 3/12
(52) U.S. Cl. .................. 427/79; 427/101; 427/103; 427/126.3; 427/226; 427/240; 427/379; 427/380; 427/404; 427/419.2; 427/419.7; 427/425; 438/3
(58) Field of Search .................. 427/240, 79, 96, 427/126.3, 404, 419.2, 419.7, 379, 380, 310, 226, 425, 101, 103; 438/3

(56) References Cited

U.S. PATENT DOCUMENTS

| | | | | |
|---|---|---|---|---|
| 5,995,359 A | * | 11/1999 | Klee et al. ................ | 361/305 |
| 6,174,564 B1 | * | 1/2001 | Scott et al. ............... | 427/126.3 |
| 6,204,139 B1 | | 3/2001 | Liu et al. | |
| 6,310,373 B1 | * | 10/2001 | Azuma et al. ............. | 257/295 |
| 6,404,003 B1 | * | 6/2002 | McMillan et al. .......... | 257/306 |
| 6,664,117 B2 | * | 12/2003 | Zhuang et al. ............ | 438/3 |
| 2003/0148545 A1 | * | 8/2003 | Zhuang et al. ............ | 438/3 |

OTHER PUBLICATIONS

Liu et al., *Electronic–pulse–induced reversible resistance change effect in magnetoresistive films*, Applied Physics Letters, vol. 76, No. 19; May 8, 2000, pp 2749–2751.

\* cited by examiner

*Primary Examiner*—Kirsten C. Jolley
(74) *Attorney, Agent, or Firm*—David C. Ripma; Matthew D. Rabdau

(57) ABSTRACT

A method of forming a perovskite thin film includes preparing a perovskite precursor solution; preparing a silicon substrate for deposition of a perovskite thin film, including forming a bottom electrode on the substrate; securing the substrate in a spin-coating apparatus and spinning the substrate at a predetermined spin rate; injecting a perovskite precursor solution into the spin-coating apparatus thereby coating the substrate with the perovskite precursor solution to form a coated substrate; baking the coated substrate at temperatures which increase incrementally from about 90° C. to 300° C.; and annealing the coated substrate at a temperature of between about 500° C. to 800° C. for between five minutes to fifteen minutes.

13 Claims, 3 Drawing Sheets

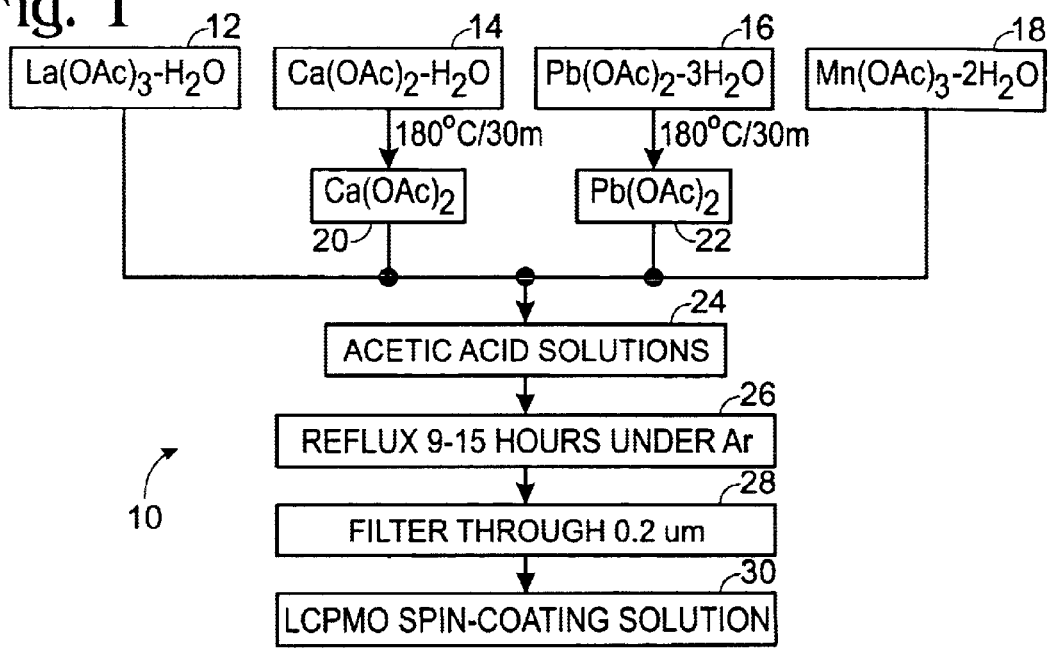
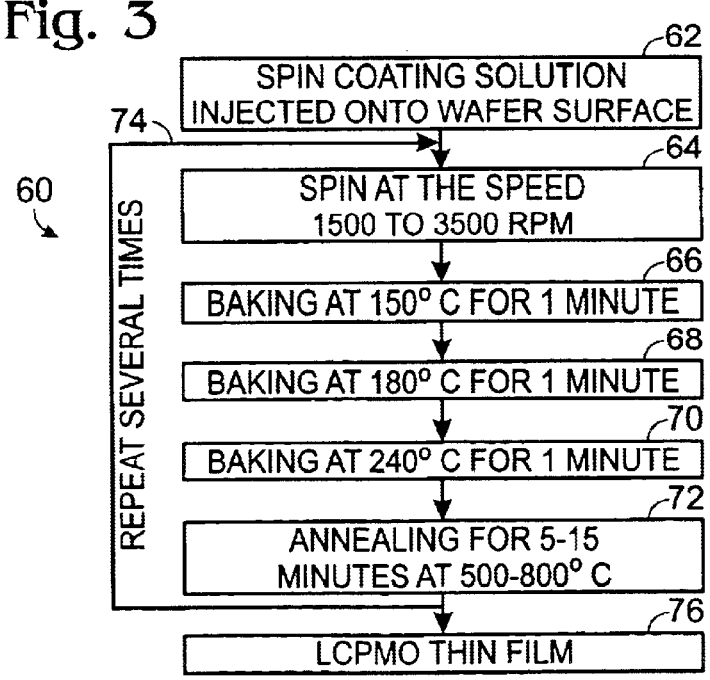

PREPARATION OF LCPMO THIN FILMS WHICH HAVE REVERSIBLE RESISTANCE CHANGE PROPERTIES

RELATED APPLICATION

This application is related to Ser. No. 10/072,225, filed Feb. 7, 2002, Commonly-owned, for *Device and method for reversible resistance change induced by electric pulses in non-crystalline perovskite unipolar programmable memory*.

FIELD OF THE INVENTION

This invention relates to a method for the preparation of a spin-coating precursor solution for perovskite material, specifically of $La_{1-x}(Ca_{x-y}Pb_y)_xMnO_3$ (LCPMO, in which x=0–0.5 and y=0–x), and a method for LCPMO thin film deposition via spin-coating technology. Additionally, a method to reversibly change LCPMO thin film resistance is incorporated into the method of the invention.

BACKGROUND OF THE INVENTION

Materials having a perovskite structure, such as colossal magnetoresistance (CMR) materials and high temperature superconductivity (HTSC) materials, have a number of uses in the IC field. An important characteristic of CMR and HTSC materials is that their electrical resistance may be changed by external influence, such as a magnetic field or an electric field, and by temperature changes, making their use in many IC applications desirable. They can sense magnetic fields, which provides improvements in the data density and reading speed of magnetic recording systems; and they can sense heat and some light wavelengths, which provides a material for thermal and infrared detectors, as well as material for photo and X-ray detection. Because a static electric field can trigger the collapse of an insulating charge-ordered state of CMR materials to a metallic ferromagnetic state, they may be used in micrometer- or nanometer-scale electromagnets.

HTSC materials are primarily used as superconductors, and their conductivity may be modified by an electric current or a magnetic field. They may also be used as a conductive layer in the epitaxial multilayer structures for use at room temperature. As previously noted, temperature, magnetic fields, and static electric fields can change the electrical characteristics of CMR and HTSC materials, however, these stimuli do not permanently alter the states or permanently modify the properties of these materials. Thus, when a stimulus vanishes, the changed material's state or property will return to its original value. The resistance of CMR materials will change when a large magnetic field is applied As the magnetic field strength increases, the resistance of the CMR material decreases. As the strength of the magnetic field decreases, and returns to zero, the resistance of the CMR material will return to its original value. However, very low temperatures cause a relatively large resistive lag in CMR materials, as is the case in ferromagnets, which exhibit a magnetic lag. According to the prior art, because CMR materials only respond to large changes in magnetic fields, or changes in static electric fields only at very low temperatures, CMR materials have not been considered practical for use in IC applications.

Reversible resistance change is a basic requirement for potential resistance based non-volatile memory devices. The prior art in this area is related to the disclosure of perovskite thin films, and specifically $Pr_{0.3}Ca_{0.7}MnO_3$ (PCMO) metal oxide thin films, which demonstrated a reversible resistance change ability through the application of electric pulses. PCMO thin films are grown on epitaxial $YBa_2Cu_3O_7$ (YBCO) and partial epitaxial platinum substrates, via pulsed laser ablation (PLA) technique. PCMO thin films having reversible resistance change characteristics are the subject of Liu et al., Electric-pulse-induced reversible resistance change effect in magnetoresistive films, Applied Physics Letters, 76, 2749, 2000; and Liu et al., U.S. Pat. No. 6,204,139, granted Mar. 20, 2001, for Method of switching the properties of perovskite materials used in thin film resistors. $Pr_{0.3}Ca_{0.7}MnO_3$ (PCMO) thin films are shown to have reversible resistance change properties via applying electric pulses at room temperature. Liu et al. demonstrated that resistance change may be controlled by adjusting the polarity of electric pulses: resistance increases under the influence of a positive pulse, and resistance decreases under the influence of a negative pulse. XRD polar figures in the Liu et al. references indicated epitaxial properties of PCMO thin films. The integration structures of PCMO thin films disclosed by Liu et al. included PCMO/YBCO/LAO, PCMO/Pt/LAO and PCMO/Pt plate. The reference and patent indicate the probability that CMR materials have reversible resistance change properties at room temperature. A method of manufacture of the resistance based, or PCMO or CRM materials, for use in non-volatile memory devices is not taught by the references.

SUMMARY OF THE INVENTION

A method of forming a perovskite thin film includes preparing a perovskite precursor solution; preparing a silicon substrate for deposition of a perovskite thin film, including forming a bottom electrode on the substrate; securing the substrate in a spin-coating apparatus and spinning the substrate at a predetermined spin rate; injecting a perovskite precursor solution into the spin-coating apparatus thereby coating the substrate with the perovskite precursor solution to form a coated substrate; baking the coated substrate at temperatures which increase incrementally from about 90° C. to 300° C.; and annealing the coated substrate at a temperature of between about 500° C. to 800° C. for between about five minutes to fifteen minutes.

It is an object of the invention to establish a method for the manufacture of a resistance-based non-volatile memory device.

Another object of the invention is to provide a method of compounding precursors for the fabrication of perovskite thin films, and specifically LCPMO thin films.

A further object of the invention is to provide a method of compounding a perovskite precursor suitable for spin-coating deposition.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 1 depicts a method of compounding a LCPMO spin-coating precursor by acid synthesis.

FIG. 3 is a block diagram of the LCPMO spin-coating method of the invention.

DETAILED DESCRIPTION OF THE PREFERRED EMBODIMENT

Figure 2:
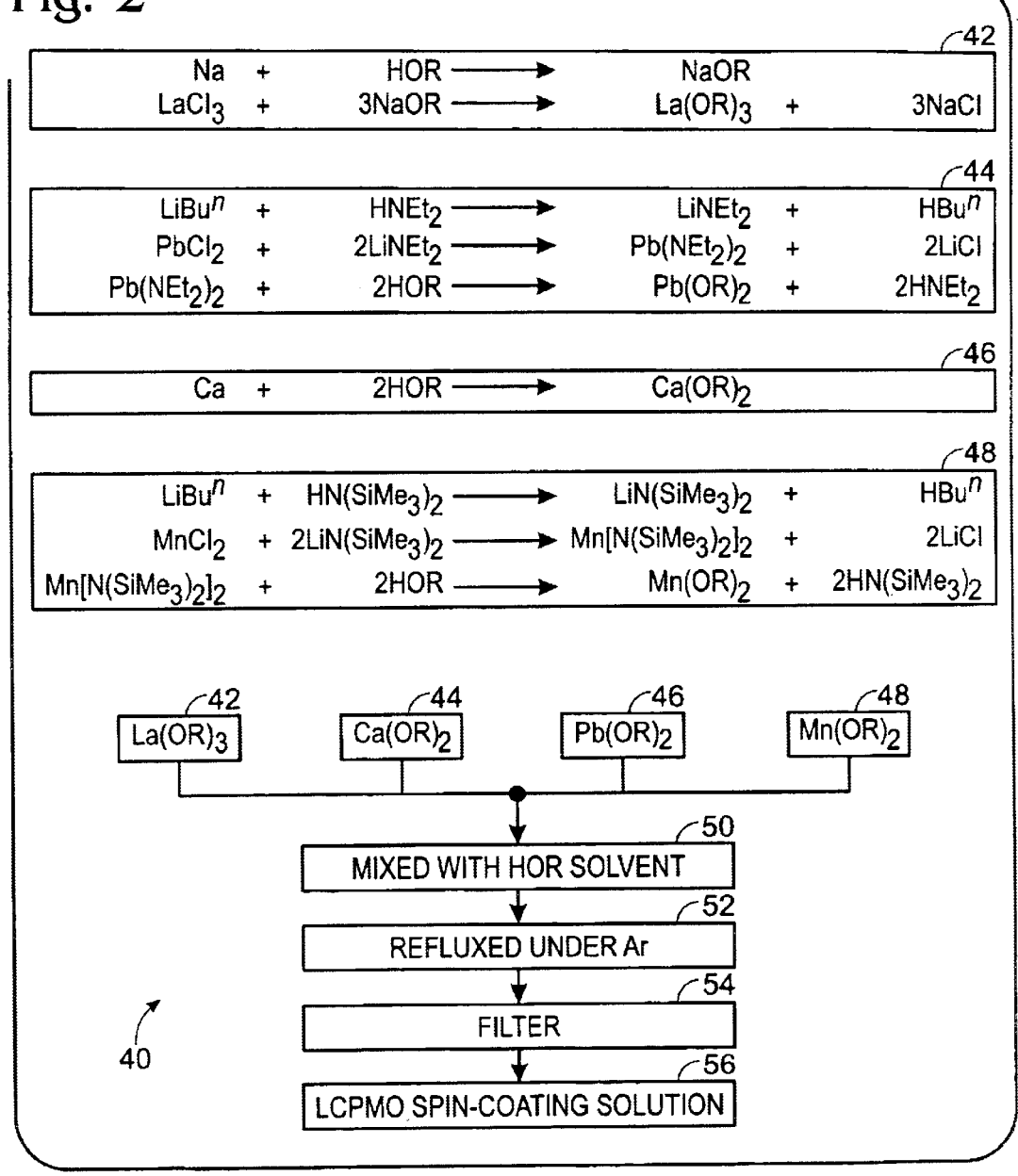
FIG. 2 depicts a method of compounding a LCPMO spin-coating precursor by metal alkoxide synthesis.

Methods related to the resistance based non-volatile memory perovskite thin film preparation, including precursor preparation, spin-coating technology, and reversible resistance change, are disclosed.

In the method of the invention, spin-coating technology is used for the deposition of perovskite material, specifically of $La_{1-x}(Ca_{x-y}Pb_y)_xMnO_3$ (LCPMO), in which x=0–0.5 and y=0–x, thin films. Platinum and iridium materials may be used as the substrate for thin film deposition. The deposited LCPMO thin films are in the form of a polycrystalline layer. Such thin films demonstrate high reversible resistance changes when electric pulses of varying duration and intensity are applied. The resistance change, according to the method of the invention, is controlled by the width and voltage of electric pulses, vice electrical polarity, as taught in the prior art.

The voltage of electric pulses, according to the method of the invention, as taught herein and in the above-cited related application, ranges from 1.0 V to 10.0 V. To increase the resistance, or to switch the resistance to a write stage, short width pulses are used. The short pulse duration time ranges from several nanoseconds to several microseconds, depending on the thin film resistance properties. To decrease the resistance, or to switch the resistance to reset stage, longer duration pulses are applied. The duration time of long pulse ranges from several nanoseconds to several seconds, again, depending on the thin film properties. Spin-coating is one of the thin film deposition methods which is suitable for commercial application of LCPMO thin films in non-volatile memory devices.

The method of the invention for forming a perovskite thin film includes preparing a perovskite precursor solution; preparing a silicon substrate for deposition of a perovskite thin film, including forming a bottom electrode on the substrate; securing the substrate in a spin-coating apparatus and spinning the substrate at a predetermined spin rate; injecting a perovskite precursor solution into the spin-coating apparatus thereby coating the substrate with the perovskite precursor solution to form a coated substrate; baking the coated substrate at temperatures which increase incrementally from about 90° C. to 300° C.; and annealing the coated substrate at a temperature of between about 500° C. to 800° C. for between about five minutes to fifteen minutes.

Two procedures for the synthesis of LCPMO spin-coating precursor solutions are described herein: the first procedure, depicted generally at 10 in FIG. 1, includes the use of hydrated metal acetic acids as starting compounds, $La(OACa)_3 \cdot H_2O$, $Ca(OACa)_2 \cdot H_2O$, $Pb(OACa)_2 \cdot 3H_2O$, and $Mn(OACa)_3 \cdot 2H_2O$, whereby OACa represents acetic acid(s) depicted in blocks 12, 14, 16 and 18, respectively. The water attached to the metal acetic acids is removed in the case of $Ca(OACa)_2 \cdot H_2O$ and $Pb(OACa)_2 \cdot 3H_2O$ by heating the chemical at between about 150° C. to 220° C. for between about fifteen minutes and one hour, blocks 20, 22, respectively. The mixture is refluxed in an argon atmosphere for between about nine hours to fifteen hours, block 26, and then filtered through a 0.2 μ filter, block 28, thereby producing clear or light yellow-green LCPMO spin-coating solution 30.

The second procedure, depicted generally at 40 in FIG. 2, includes first compounding metal alkoxides according to the protocols depicted in blocks 42, 44, 46 and 48. to produce $La(OR)_3$, $Pb(OR)_2$, $Ca(OR)_2$ and $Mn(OR)_2$, respectively. A selected metal alkoxide is mixed with a corresponding alcohols, such as $R=CH_2CH_3$, $CH_2CH_3OCH_3$, $CH(CH_3)_2$, and $CH_2CH_2CH_3$, to designated concentrations of between about 0.05N and 1.0N, block 50, and the mixtures are refluxed in an argon atmosphere for between about 30 minutes and five hours, block 52. The mixture is filtered through 0.2 μm filter, block 54, for purification, resulting in a LCPMO spin-coating solution, block 56.

Figure 4:
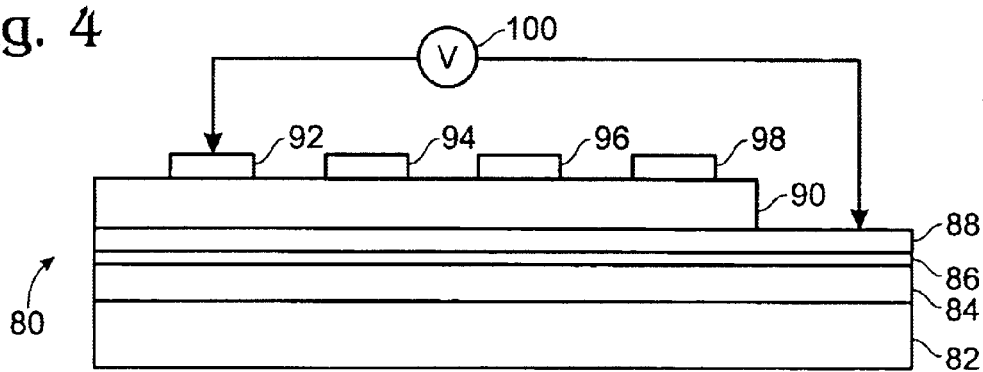
FIG. 4 depicts a resistance measurement structure.
Figure 5:
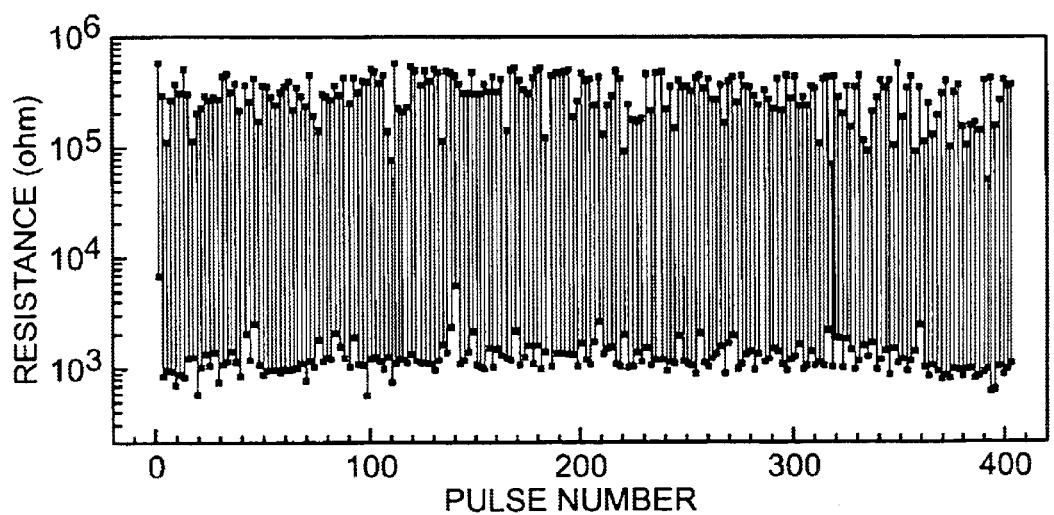
FIG. 5 depicts the reversible resistance change for LCPMO thin film.

LCPMO thin films may be formed on substrates via spin-coating processes, as depicted in FIG. 3, generally at 60. The substrate materials onto which the LCPMO thin film is deposited include platinum and iridium metals, which are deposited onto a silicon wafer in the following thickness protocols: a first layer of oxide, most likely $SiO_2$, having a thickness of between about 500 Å–8000 Å, a second layer of metal taken from the group of metals consisting of titanium, TiN and TaN, having a thickness of between about 50 Å–500 Å, and a third layer of platinum, having a thickness of between about 500 Å–2000 Å. In the case where iridium is used, a first layer of oxide, most likely $SiO_2$, has a thickness of between about 500 Å–8000 Å, a second layer of metal taken from the group of metals consisting of titanium, TiN and TaN, has a thickness rib of between about 100 Å–1000 Å, and a third layer of iridium has a thickness of between about 500 Å–2000 Å. During the spin-coating procedure, the spin-coating solution, having a concentration in the range of between about 0.05N to 1.0N, is uniformly injected onto the substrate surface, block 62. The spin speed is a predetermined spin rate of between about 1500 RPM to 3500 RPM, block 64. The thin film is baked over an incremental temperature range for about one minute at each temperature, wherein the temperatures are about 150° C., block 66, 180° C., block 68, and 240° C., block 70, taking a total of between about three minutes to six minutes for the entire baking process. The thin film is then annealed at higher temperatures, ranging from between about 500° C. to 800° C., for between about five minutes to fifteen minutes, block 72. The number of spin-coating procedures are repeated, block 74, until a desired LCPMO thin film 76 thickness is obtained, depending on the specific properties of the LCPMO thin film. For example, a LCPMO thickness of 1500 Å may be obtained by using 0.25N LCPMO precursor solution and subjecting the substrate to three coating procedures. The baking temperatures may also be varied, ranging from between about 90° C. to 300° C. After annealing, a top electrode, of either platinum or iridium, is deposited. During the testing of the method of the invention, the thin film electric properties were measured. The measurement structure used is depicted in FIG. 4, generally at 80. Structure 80 includes a silicon wafer 82, having a layer of $SiO_2$, the first layer, deposited thereon. A layer of titanium, the second layer, 86, is located on the $SiO_2$ layer. A bottom electrode, platinum in this example, the third layer, 88 is located over the titanium layer. A layer of LCPMO thin film 90, which in this example was formed from a LCPMO precursor originating from a $La_{0.7}Ca_{0.15}Pb_{0.15}MnO_3$ and deposited to a thickness of 15000 Å, is located on platinum bottom electrode 88. A number of top electrodes, 92, 94, 96 and 98, are depicted, and are formed of platinum, deposited to a thickness of about 1500 Å. The resistance was determined on a HP-4145B semiconductor analyzer 100. The voltage ranged from between about 0.1V to 0.5V. A short pulse was generated from a pulse generator, and depicted on an oscilloscope. The thin film demonstrated a reversible resistance change, as depicted in FIG. 5.

To increase the thin film resistance, a short width pulse was applied. The short pulse width ranged from between about 5 ns to 1 $\mu$s, and the pulse voltage ranged from between about 1V to 5V. To decrease the resistance, a long width pulse was applied. The long pulse width ranged from several nanoseconds to several seconds, and the pulse voltage ranged from 1V to as high as 5V. The applied pulse condition changed with the different LCPMO samples. FIG. 5 depicts a sample in which reversibly changed over 400 cycles. The two reversible resistant stages exhibited in LCPMO sample indicated the potential LCPMO thin film application as non-volatile memory device. The high resistance stage corresponds to the memory "write" state, while the low resistance stage, to the memory "reset" state. The reversible switch between two stages can be realized via a different pulse width.

Thus, a method for preparation of LCPMO thin films which have reversible resistance change properties has been disclosed. It will be appreciated that further variations and modifications thereof may be made within the scope of the invention as defined in the appended claims.

We claim:

1. A method of forming a perovskite thin film comprising:
   preparing a perovskite precursor solution including the following hydrated metal acetic acids: $La(OACa)_3.H_2O$, $Ca(OACa)_2.H_2O$, $Pb(OACa)_2.3H_2O$, and $Mn(OACa)_3.2H_2O$;
   preparing a silicon substrate for deposition of a perovskite thin film, including forming a bottom electrode on the substrate;
   securing the substrate in a spin-coating apparatus and spinning the substrate at a predetermined spin rate;
   injecting the perovskite precursor into the spin-coating apparatus thereby coating the substrate with the perovskite precursor solution to form a coated substrate;
   baking the coated substrate at temperatures which increase incrementally from about 90° C. to 300° C.; and
   annealing the coated substrate at a temperature of between about 500° C. to 800° C. for between about five minutes to fifteen minutes.

2. The method of claim 1 wherein said preparing a perovskite precursor solution includes removing the water from the $Ca(OACa)_2.H_2O$ and $Pb(OACa)_2.3H_2O$ acids by heating the hydrated acetic acid at a temperature of between about 150° C. to 220° C. for between about fifteen minutes and one hour;
   refluxing the acetic acids in an argon atmosphere for between about nine hours to fifteen hours; and
   filtering the refluxed acetic acids through a filter having a mesh of about 0.2$\mu$ thereby producing a perovskite precursor spin-coating solution.

3. The method of claim 1 wherein said preparing a substrate includes forming a first layer of oxide on the silicon substrate, forming a second layer on the oxide layer, and forming a third layer of metal as the bottom electrode on the second layer.

4. The method of claim 4 wherein said forming the third layer of metal includes selecting a metal taken from the group of metals consisting of platinum and iridium, and wherein said forming the third layer of metal includes forming a layer of metal having a thickness of between about 500 Å to 2000 Å.

5. The method of claim 4 wherein said forming the second layer includes selecting a material taken from the group consisting of titanium, TiN and TaN, and wherein said forming the second layer includes forming a layer having a thickness of between about 50 Å to 1000 Å.

6. The method of claim 3 wherein said forming the first layer of oxide includes forming a layer of $SiO_2$ to a thickness of between about 500 Å to 8000 Å.

7. The method of claim 1 which further includes forming a top metal electrode on the perovskite layer, wherein the said forming a top metal electrode includes forming an electrode of a metal taken from the group of metals consisting of platinum and iridium.

8. The method of claim 1 wherein said spinning the substrate at a predetermined spin rate includes spinning the substrate at a rate in a range of between about 1500 RPM to 3500 RPM.

9. A method of forming a perovskite thin film consisting of:
   preparing a perovskite precursor solution, taken from the group of preparation methods consisting of:
   (a) selecting the following hydrated metal acetic acids: $La(OACa)_3.H_2O$, $Ca(OACa)_2.H_2O$, $Pb(OACa)_2.3H_2O$, and $Mn(OACa)_3.2H_2O$;
     removing the water from the $Ca(OACa)_2.H_2O$ and $Pb(OACa)_2.H_2O$ acids by heating the hydrated acetic acid at a temperature of between about 150° C. to 220° C. for between about fifteen minutes and one hour,
     refluxing the acetic acids in an argon atmosphere for between about nine hours to fifteen hours, and
     filtering the refluxed acetic acids through a filter having a mesh of about 0.2$\mu$ thereby producing a perovskite precursor spin-coating solution, and
   (b) selecting the following metal alkoxides: $La(OR)_3$, $Pb(OR)_2$, $Ca(OR)_2$ and $Mn(OR)_2$;
     mixing the selected metal alkoxides with a selected alcohol to a concentration of between about 0.05N to 1.0N to form an alcohol solution;
     refluxing the alcohol solution in an argon atmosphere for between about thirty minutes to five hours; and filtering the refluxed alcohol solution through a filter having a mesh of about 0.2µ thereby producing a perovskite precursor spin-coating solution;

preparing a silicon substrate for deposition of a perovskite thin film, including forming a bottom electrode on the substrate;

securing the substrate in a spin-coating apparatus and spinning the substrate at a predetermined spin rate;

injecting the perovskite precursor solution into the spin-coating apparatus thereby coating the substrate with the perovskite precursor solution to form a coated substrate;

baking the coated substrate; and annealing the coated substrate.

10. The method of claim 9 wherein said baking the coated substrate includes baking the coated substrate at temperatures which increase incrementally from about 90° C. to 300° C.

11. The method of claim 9 wherein said annealing the coated substate includes annealing the coated substrate at a temperature of between about 500° C. to 800° C. for between about five minutes to fifteen minutes.

12. The method of claim 9 wherein said preparing a substrate includes forming a first layer of oxide on the silicon substrate, forming a second layer on the oxide layer, and forming a bottom electrode on the second layer;

wherein said forming the first layer of oxide includes forming a layer of $SiO_2$ to a thickness of between about 500 Å to 8000 Å;

wherein said forming the second layer includes selecting a material taken from the group consisting of titanium, TiN and TaN, and wherein said forming the second layer includes forming a layer having a thickness of between about 50 to 1000; and wherein said forming the bottom electrode includes selecting a metal taken from the group of metals consisting of platinum and iridium, and wherein said forming the bottom electrode includes forming a layer of metal having a thickness of between about 500 Å to 2000 Å.

13. The method of claim 9 which further includes forming a top metal electrode on the perovskite layer, wherein the said forming a top metal electrode includes forming an electrode of a metal taken from the group of metals consisting of platinum and iridium.

\* \* \* \* \*